(12) United States Patent
Hsu et al.

(10) Patent No.: US 7,439,108 B2
(45) Date of Patent: Oct. 21, 2008

(54) COPLANAR SILICON-ON-INSULATOR (SOI) REGIONS OF DIFFERENT CRYSTAL ORIENTATIONS AND METHODS OF MAKING THE SAME

(75) Inventors: Louis Lu-Chen Hsu, Fishkill, NY (US); Jack A. Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 97 days.

(21) Appl. No.: 11/155,030

(22) Filed: Jun. 16, 2005

(65) Prior Publication Data

US 2006/0284251 A1 Dec. 21, 2006

(51) Int. Cl.
*H01L 21/00* (2006.01)
*H01L 21/84* (2006.01)

(52) U.S. Cl. ............... 438/150; 438/152; 438/155; 438/198; 257/E21.416

(58) Field of Classification Search ............... 438/150, 438/152, 155, 198; 257/E21.416
See application file for complete search history.

(56) References Cited

U.S. PATENT DOCUMENTS

| | | | |
|---|---|---|---|
| 5,296,410 | A | 3/1994 | Yang |
| 5,734,564 | A | 3/1998 | Brkovic |
| 5,882,987 | A | 3/1999 | Srikrishnan |
| 6,815,278 | B1 | 11/2004 | Ieong et al. |
| 6,830,962 | B1 | 12/2004 | Guarini et al. |
| 6,972,478 | B1 | 12/2005 | Waite et al. |
| 6,998,684 | B2 | 2/2006 | Anderson et al. |
| 7,060,585 | B1 | 6/2006 | Cohen et al. |
| 7,125,785 | B2 | 10/2006 | Cohen et al. |
| 7,148,092 | B2 | 12/2006 | Isobe et al. |
| 2003/0218171 | A1 | 11/2003 | Isobe et al. |
| 2004/0256700 | A1 | 12/2004 | Doris |
| 2005/0082531 | A1 | 4/2005 | Rim |
| 2005/0277260 | A1 | 12/2005 | Cohen et al. |
| 2006/0024931 | A1 | 2/2006 | Chan et al. |
| 2006/0073646 | A1 | 4/2006 | Yang |
| 2006/0113605 | A1* | 6/2006 | Currie ...................... 257/368 |
| 2006/0170045 | A1 | 8/2006 | Yan et al. |
| 2006/0231893 | A1* | 10/2006 | Bernstein et al. ............ 257/347 |
| 2006/0272574 | A1 | 12/2006 | Waite et al. |
| 2007/0015346 | A1* | 1/2007 | Cohen et al. ................ 438/481 |

OTHER PUBLICATIONS

Melanie J. Sherony et al., "Minimization of Threshold Voltage Variation in SOI MOSFETs," Proceedings 1994 IEEE International SOI Conference, Oct. 1994, pp. 131-132.

J. A. Mandelman et al., "Floating-Body Concerns for SOI Dynamic Random Access Memory (DRAM)," Proceedings 1996 IEEE International SOI Conference, Oct. 1996, pp. 136-137.

(Continued)

*Primary Examiner*—Ngan Ngo
(74) *Attorney, Agent, or Firm*—Dugan & Dugan

(57) ABSTRACT

In a first aspect, a first method is provided for semiconductor device manufacturing. The first method includes the steps of (1) providing a substrate; and (2) forming a first silicon-on-insulator (SOI) region having a first crystal orientation, a second SOI region having a second crystal orientation and a third SOI region having a third crystal orientation on the substrate. The first, second and third SOI regions are coplanar. Numerous other aspects are provided.

4 Claims, 16 Drawing Sheets

OTHER PUBLICATIONS

R. Islam et al., "Wafer Level Packaging and 3D Interconnect for IC Technology," 2002 IEEE/SEMI Advanced Semiconductor Manufacturing Conference, pp. 212-217.

N. Sato et al., "Precise Thickness Control for Ultra-Thin SOI in ELTRAN® SOI-Epi™ Wafer," 2002 IEEE International SOI Conference, Oct. 2002, pp. 209-210.

A. Vandooren et al., "Scaling Assessment of Fully-Depleted SOI Technology at the 30nm Gate Length Generation," 2002 IEEE International SOI Conference, Oct. 2002, pp. 25-27.

P. Lindner et al., "3D Interconnect through Aligned Wafer Level Bonding," 2002 Electronic Components and Technology Conference, pp. 1439-1443.

M. Yang et al., "High Performance CMOS Fabricated on Hybrid Substrate With Different Crystal Orientations," 2003 IEEE, pp. 18.7.1-18.7.4.

M. Yang et al., "On the Integration of CMOS with Hybrid Crystal Orientations," 2004 Symposium on VLSI Technology Digest of Technical Papers, pp. 160-161.

Akiko Ohata et al., "Mobility Issues in Ultra-Thin SOI MOSFETs: Thickness Variations, GIFBE and Coupling Effects," 2004 IEEE, pp. 109-112.

Toshinori Numata, "Device Design for Subthreshold Slope and Threshold Voltage Control in Sub-100-nm Fully Depleted SOI MOSFETs," IEEE Transactions on Electron Devices, vol. 51, No. 12, Dec. 2004, pp. 2161-2167.

Sixto Ortiz Jr., http://www.processor.com/Editorial/article.asp?article=articles/p2548/31p48.asp&g..., IBM Extends Silicon With SSDOI, published Nov. 28, 2003, vol. 25, Issue 48.

* cited by examiner

COPLANAR SILICON-ON-INSULATOR (SOI) REGIONS OF DIFFERENT CRYSTAL ORIENTATIONS AND METHODS OF MAKING THE SAME

CROSS-REFERENCE TO RELATED APPLICATIONS

The present application is related to U.S. patent application Ser. No. 11/154,906, filed Jun. 16, 2005 and titled "HYBRID ORIENTED SUBSTRATES AND CRYSTAL IMPRINTING METHODS FOR FORMING SUCH HYBRID ORIENTED SUBSTRATES", and U.S. patent application Ser. No. 11/154,907, filed Jun 16, 2005 and titled "CRYSTAL IMPRINTING METHODS FOR FABRICATING SUBSTRATES WITH THIN ACTIVE SILICON LAYERS", both of which are hereby incorporated by reference herein in their entirety.

FIELD OF THE INVENTION

The present invention relates generally to semiconductor devices, and more particularly to coplanar silicon-on-insulator (SOI) regions of different crystal orientations and methods of making the same.

BACKGROUND

Forming regions on a substrate having different crystal orientations may improve operation of semiconductor devices formed on the substrate. For example, the optimal crystal orientation for a p-channel metal-oxide semiconductor field-effect transistor (PFET) is different than the optimal crystal orientation for an n-channel metal-oxide semiconductor field-effect transistor (NFET). Further, if the different crystal regions are silicon-on-insulator (SOI) regions, other benefits, such as low junction capacitance, for example, also may be realized. Accordingly, methods of making coplanar silicon-on-insulator (SOI) regions of different crystal orientations are desired.

SUMMARY OF THE INVENTION

In a first aspect of the invention, a first method is provided for semiconductor device manufacturing. The first method includes the steps of (1) providing a substrate; and (2) forming a first silicon-on-insulator (SOI) region having a first crystal orientation, a second SOI region having a second crystal orientation and a third SOI region having a third crystal orientation on the substrate. The first, second and third SOI regions are coplanar.

In a second aspect of the invention, a second method is provided for semiconductor device manufacturing. The second method includes the steps of (1) providing a substrate; (2) forming a bulk substrate region having a first crystal orientation, a first silicon-on-insulator (SOI) region having a second crystal orientation and a second SOI region having a third crystal orientation on the substrate; and (3) forming an electrical contact between two of the bulk substrate region, first SOI region and second SOI region. The bulk substrate region, first SOI region and second SOI region are coplanar.

In a third aspect of the invention, a first apparatus is provided. The first apparatus is a semiconductor structure that includes a semiconductor substrate having (1) a bulk substrate region having a first crystal orientation; (2) a first silicon-on-insulator (SOI) region having a second crystal orientation; (3) a second SOI region having a third crystal orientation; and (4) an electrical contact between two of the bulk substrate region, first SOI region and second SOI region. The bulk substrate region, first SOI region and second SOI region are coplanar.

In a fourth aspect of the invention, a second apparatus is provided. The second apparatus is a semiconductor structure that includes a semiconductor substrate having (1) a first silicon-on-insulator (SOI) region having a first crystal orientation; (2) a second SOI region having a second crystal orientation; and (3) a third SOI region having a third crystal orientation. The first, second and third SOI regions are coplanar. Numerous other aspects are provided in accordance with these and other aspects of the invention.

Other features and aspects of the present invention will become more fully apparent from the following detailed description, the appended claims and the accompanying drawings.

DETAILED DESCRIPTION

The present invention provides improved semiconductor devices and methods for making the same. More specifically, the present invention provides coplanar silicon-on-insulator (SOI) regions of different crystal orientations and methods of making the same. For example, three or more coplanar SOI regions, each of which has a different crystal orientation may be formed on a substrate. Alternatively, a plurality of coplanar SOI regions, having different respective crystal orientations, and a coplanar bulk substrate region having a different crystal orientation adjacent an SOI region may be formed on a substrate. Further in some embodiments, a contact may be formed between the bulk substrate region and an adjacent SOI region. In this manner, in contrast to a floating state, the contacted SOI region may be coupled to an established voltage.

FIGS. 1-10 illustrate cross-sectional side views of a first exemplary method of forming coplanar silicon-on-insulator (SOI) regions of different crystal orientations on a substrate in accordance with an embodiment of the present invention, and FIGS. 11-16 illustrate cross-sectional side views of a second exemplary method of forming coplanar SOI regions of different crystal orientations on a substrate in accordance with an embodiment of the present invention.

Figure 1:
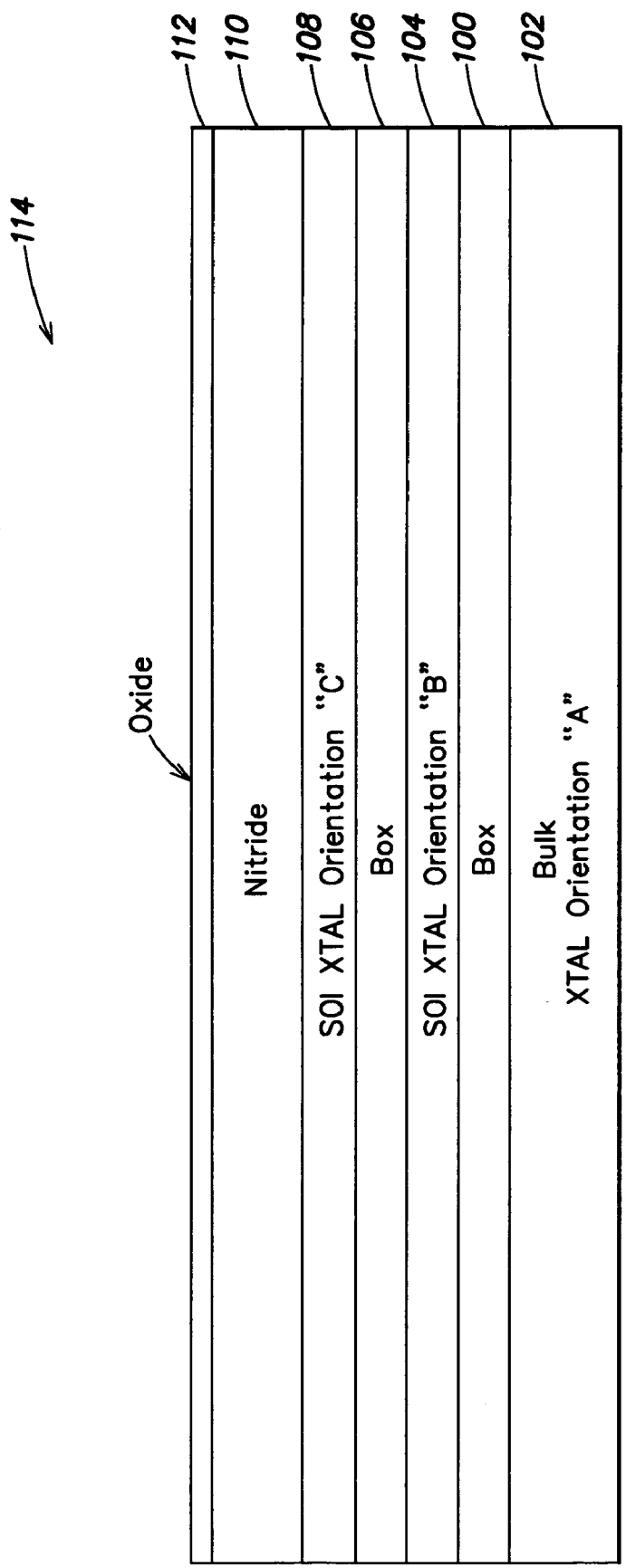
FIG. 1 illustrates a cross-sectional side view of a step of a first exemplary method of forming coplanar silicon-on-insulator (SOI) regions of different crystal orientations on a substrate in accordance with an embodiment of the present invention.

With reference to FIG. 1, a first oxide layer 100 may contact a silicon bulk substrate 102. The bulk substrate 102 may have a first crystal orientation A. More specifically, silicon in the bulk substrate 102 may have a first crystal orientation. For example, the bulk substrate 102 may have one of a plurality of crystal orientations such as "100", "110", "111", etc. Crystal orientations, and benefits thereof during semiconductor device manufacturing, are known to a person of skill in the art, and therefore, are not described in detail herein.

As shown in FIG. 1, a first silicon-on-insulator (SOI) layer 104 is provided on the first oxide layer 100 so that the first oxide layer is a first buried oxide (BOX) layer 100. The first BOX layer 100 may serve as a back oxide for the first SOI layer 104. The first SOI layer 104 may have a second crystal orientation B (e.g., different from the first crystal orientation A). A second oxide layer 106 may contact the first SOI layer 104, and a second silicon-on-insulator (SOI) layer 108 may contact the second oxide layer 106 so that the second oxide layer 106 is a second buried oxide (BOX) layer 106. The second BOX layer 106 may serve as a back oxide for the second SOI layer 108. The second SOI layer 108 may have a third crystal orientation C (e.g., different from the first and second crystal orientations A, B). A nitride layer 110 may contact the second SOI layer 108 and an oxide layer 112 may contact the nitride layer 110. In some embodiments, the nitride layer 110 may be about 50 nm to about 500 nm thick and the oxide layer 112 may be about 10 nm to about 50 nm thick (although a larger or smaller and/or different thickness range may be employed for the nitride layer 110 and/or the oxide layer 112). The oxide layer 112 may serve to demark the nitride layer during a subsequent processing (e.g., polishing) step. In this manner, the substrate 114 including a bulk substrate layer 102 of the first crystal orientation A, a first SOI layer 104 of the second crystal orientation B and a second SOI layer 108 of the third crystal orientation C may be provided. Although, the substrate 114 includes three layers 102, 104, 108 each of which has a different crystal orientation, it should be understood that the substrate may include a larger number of layers, each of which has a different crystal orientation. Methods described in U.S. Pat. No. 5,523,602, filed Aug. 16, 1994 and titled "Multi-layered structure having single crystalline semiconductor film formed on insulator", U.S. Pat. No. 5,453,394, filed Jan. 28, 1993 and titled "Process for preparing semiconductor substrate by bringing first and second substrates in contact" and U.S. Pat. No. 5,374,564, filed Sep. 15, 1992 and titled "Process for the production of thin semiconductor material films", along with U.S. Pat. No. 5,366,923, filed Dec. 8, 1993 and titled "Bonded wafer structure having a buried insulation layer" and U.S. Pat. No. 5,882,987, filed Aug. 26, 1997 and titled "Smart-cut process for the production of thin semiconductor material films", both of which are assigned to the assignee of the present invention, IBM Corporation of Armonk, N.Y., may be employed to form the multi-layer substrate shown in FIG. 1. All of the above-cited references are hereby incorporated by reference herein in their entirety.

Figure 2:
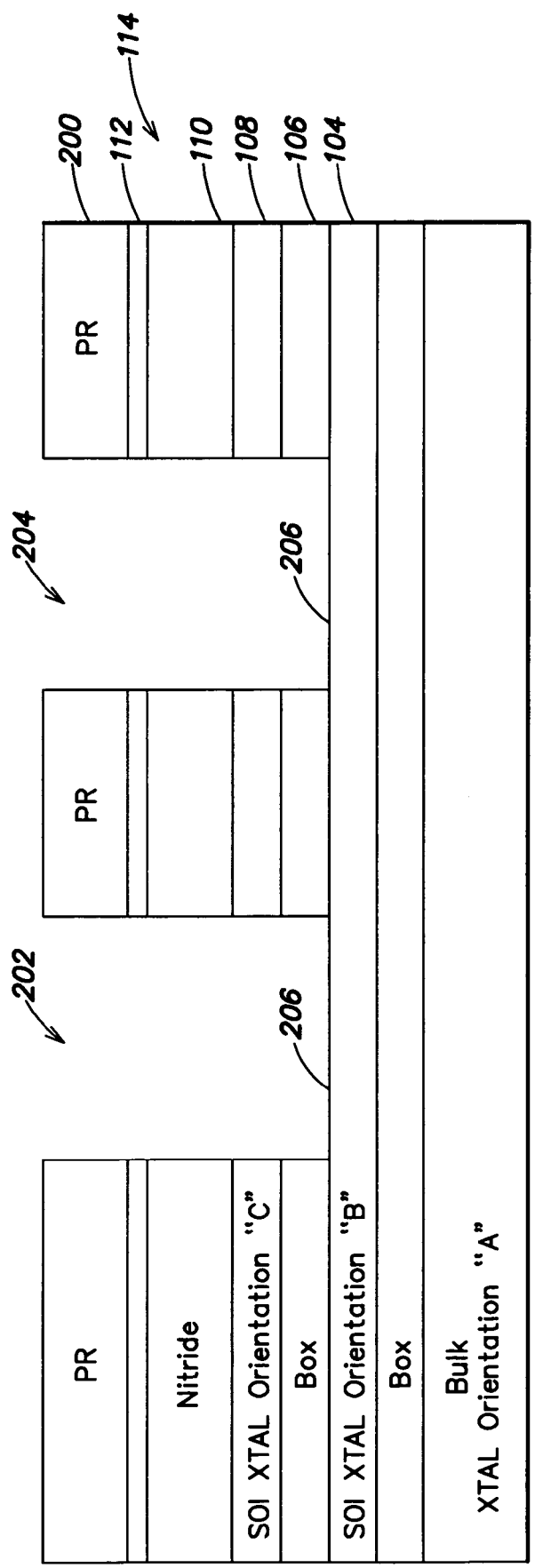
FIG. 2 illustrates a step of the first exemplary method of forming coplanar SOI regions of different crystal orientations on a substrate in which nitride, a silicon layer of a third crystal orientation and an oxide layer underlying the silicon layer of the third crystal orientation are etched in accordance with an embodiment of the present invention.

FIG. 2 illustrates a step of the first exemplary method of forming coplanar SOI regions of different crystal orientations on a substrate in which nitride, a silicon layer of a third crystal orientation and an oxide layer underlying the silicon layer of the third crystal orientation are etched in accordance with an embodiment of the present invention. With reference to FIG. 2, a spin-on technique or another suitable method may be employed to deposit a photoresist layer 200 on the substrate 114. The photoresist layer 200 may be patterned with a mask such that portions of the photoresist layer 200 may be removed during a subsequent process (e.g., developing). Reactive ion etching (RIE) or another suitable method may be employed to etch portions of the oxide, nitride, second SOI and second buried oxide layers 112, 110, 108, 106. In this manner, one or more recesses may be formed in the substrate 114. The one or more recesses (e.g., a first and second recess 202, 204) may expose portions of a top surface 206 of the first SOI layer 104. The first recess 202 may be about 45 nm to 1000 nm wide, the second recess 204 may be about 45 nm to 1000 nm wide, the unetched portion of the substrate 114 between the first and second recesses 202, 204 may be about 45 nm to 1000 nm wide, the remaining unetched portion of the substrate 114 adjacent the first recess 202 may be about 1000 nm wide and the remaining unetched portion of the substrate 114 adjacent the second recess 204 may be about 1000 nm wide. However, one or more of the above-described widths may be different.

Figure 3:
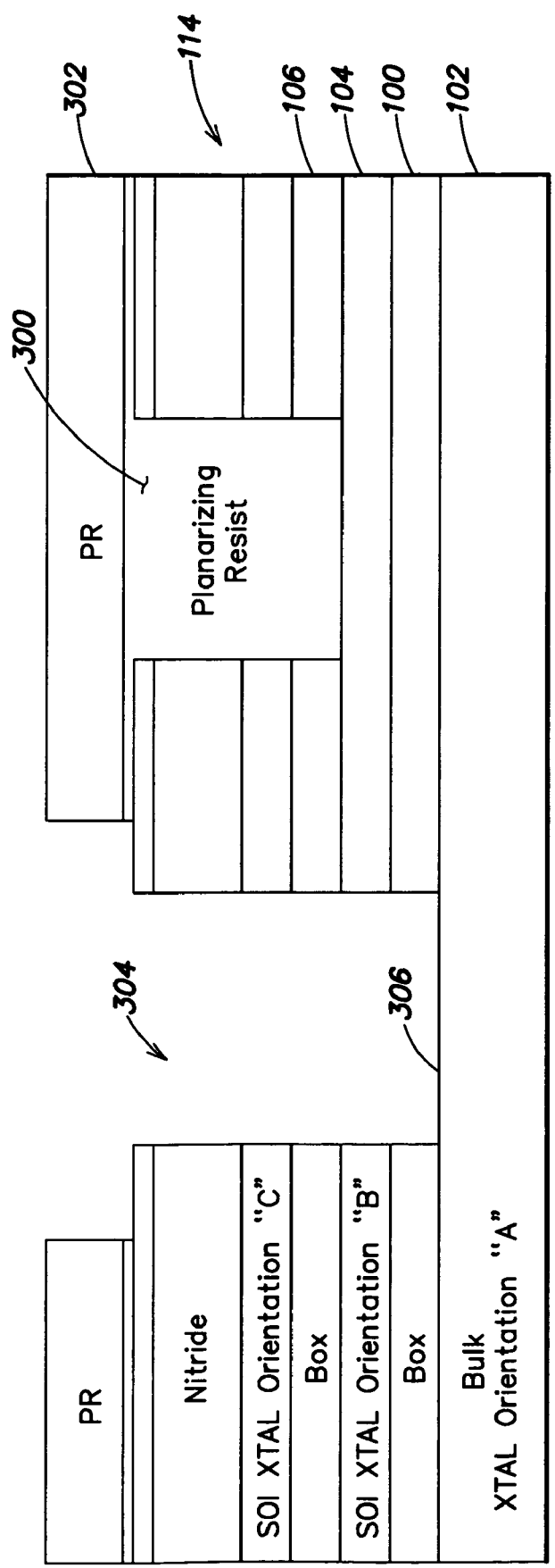
FIG. 3 illustrates a step of the first exemplary method of forming coplanar SOI regions of different crystal orientations on a substrate in which portions of planarizing resist deposited on the substrate, a silicon layer of a second crystal orientation and an oxide layer underlying the silicon layer of the second crystal orientation are etched in accordance with an embodiment of the present invention.

FIG. 3 illustrates a step of the first exemplary method of forming coplanar SOI regions of different crystal orientations on a substrate in which portions of planarizing resist deposited on the substrate, a silicon layer of a second crystal orientation and an oxide layer underlying the silicon layer of the second crystal orientation are etched in accordance with an embodiment of the present invention. With reference to FIG. 3, the patterned photoresist layer (200 in FIG. 2) may be stripped from the substrate 114 using a photoresist stripper bath or another suitable method. A layer of planarizing resist 300 may be spun on to the substrate 114. Alternatively, another suitable method may be employed to form the layer of planarizing resist 300 on the substrate 114. In this manner, the planarizing resist 300 may fill the one or more recesses 202, 204 and form a planar surface on the substrate 114. Thereafter, a spin-on technique or another suitable method may be employed to deposit a second layer photoresist 302 on the substrate 114. Photolithography using the resist and appropriate masking or another suitable method may be employed to pattern the second photoresist layer 302. The second photoresist layer 302 may be patterned such that one or more previously-etched regions of the substrate 114, such a region where a recess 202, 204 was formed in the step illustrated in FIG. 2, may be exposed (e.g., during a subsequent process such as etching).

RIE or another suitable method may be employed to etch exposed portions of the planarizing resist layer 300, first SOI layer 104 and first buried oxide layer 100. In this manner a third recess 304 may be formed. The third recess 304 may expose a portion of a top surface 306 of the bulk substrate 102.

Figure 4:
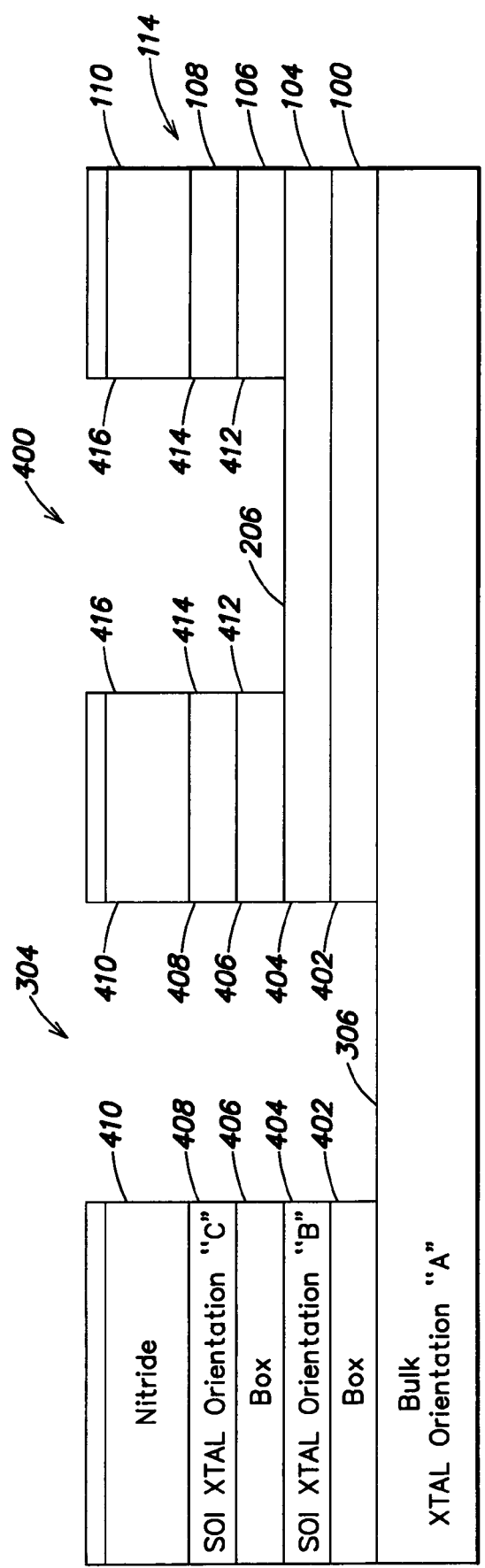
FIG. 4 illustrates a step of the first exemplary method of forming coplanar SOI regions of different crystal orientations on a substrate in which photoresist is stripped in accordance with an embodiment of the present invention.

FIG. 4 illustrates a step of the first exemplary method of forming coplanar SOI regions of different crystal orientations on a substrate in which photoresist is stripped in accordance with an embodiment of the present invention. With reference to FIG. 4, a photoresist stripper bath or another suitable method may be employed to strip resist from the substrate 114. In this manner, the second photoresist layer (302 in FIG. 3) and planarizing resist layer (300 in FIG. 3) may be removed from the substrate 114. Consequently, the third recess 304 and a fourth recess 400 remain. In the third recess 304, sidewalls 402, 404, 406, 408, 410 of the first BOX layer 100, first SOI layer 104, second BOX layer 106, second SOI layer 108 and nitride layer 110 may be exposed. Additionally, as stated, a portion of the top surface 306 of the bulk substrate 102 is exposed. Similarly, in the fourth recess 400, additional sidewalls 412, 414, 416 of the second BOX layer 106, second SOI layer 108 and nitride layer 110 may be exposed. Additionally, a portion of the top surface 206 of the first SOI layer 104 may be exposed.

Figure 5:
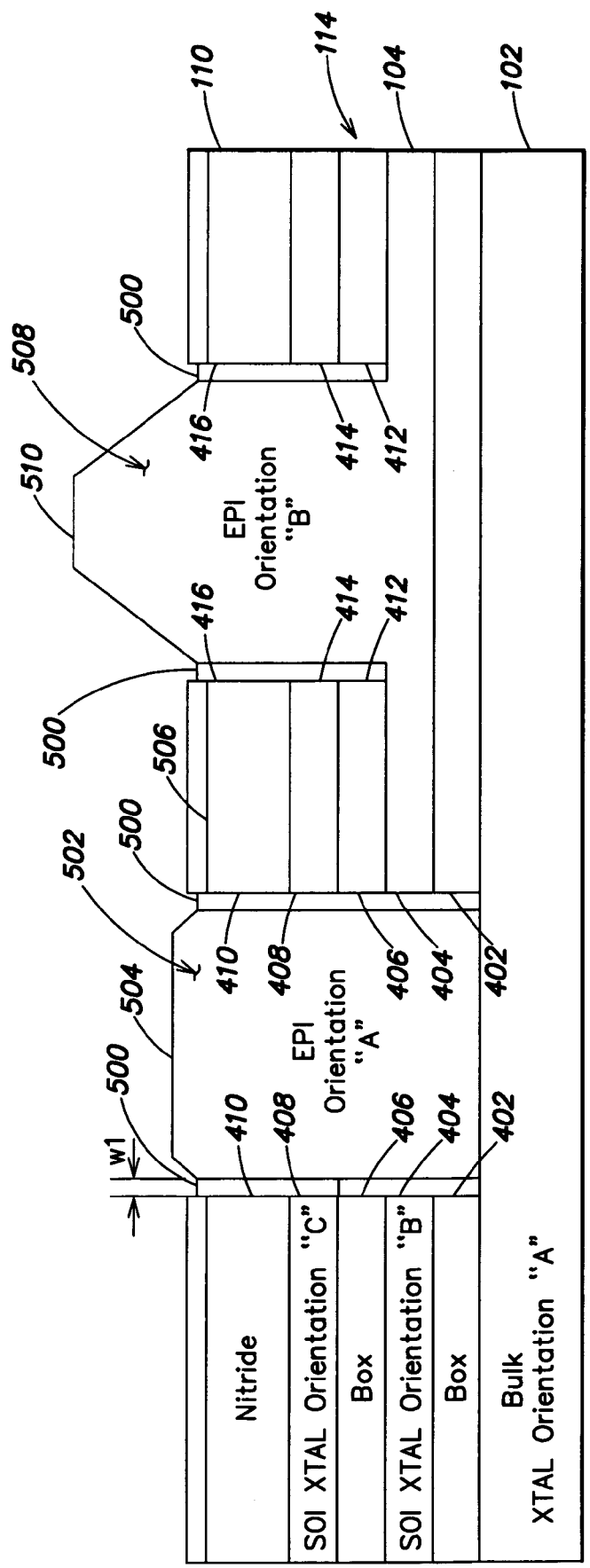
FIG. 5 illustrates a step of the first exemplary method of forming coplanar SOI regions of different crystal orientations on a substrate in which oxide spacers are formed on exposed sidewalls and silicon is epitaxially grown on the silicon layer of the first crystal orientation and the silicon layer of the second crystal orientation in accordance with an embodiment of the present invention.

FIG. 5 illustrates a step of the first exemplary method of forming coplanar SOI regions of different crystal orientations on a substrate in which oxide spacers are formed on exposed sidewalls and silicon is epitaxially grown on the silicon layer of the first crystal orientation and the silicon layer of the second crystal orientation in accordance with an embodiment of the present invention. With reference to FIG. 5, oxide spacers 500 may be formed on exposed sidewalls 402, 404, 406, 408, 410 in the third recess (304 in FIG. 4) and exposed sidewalls 412, 414, 416 in the fourth recess (400 in FIG. 4). More specifically, a layer of oxide may be deposited (e.g., conformally) on a top surface of the substrate 114 using CVD or another suitable method. Thereafter, RIE or another suitable method may be employed to etch portions of the deposited oxide layer such that the oxide spacers 500 remain. In some embodiments, the oxide spacers may have a width w1 of about 2 nm to about 200 nm, and more preferably of about 10 nm to about 30 nm. However, a larger or smaller range and/or different range may be employed for the oxide spacer width).

Silicon 502 may be epitaxially grown on the exposed portion of the top surface (306 in FIG. 4) of the bulk substrate layer 102. Consequently, silicon 502 having a first crystal orientation A may be formed in the third recess (304 in FIG. 4). A top surface 504 of the grown silicon may extend above a top surface 506 of the nitride layer 110. Similarly, silicon 508 may be epitaxially grown on the exposed portion of the top surface (206 in FIG. 4) of the first SOI layer 104. Consequently, silicon having a second crystal orientation B may be formed in the third recess (304 in FIG. 4). A top surface 510 of the grown silicon may extend above the nitride layer 110. In this manner, exposed portions of the top surfaces (306, 206 in FIG. 4) of the bulk substrate 102 and the first SOI layer 104 may serve as seed layers during silicon epitaxy. The oxide spacer 500 may prevent epitaxially grown silicon 502, 508 from nucleating on exposed sidewalls (402, 404, 406, 408, 410 412, 414, 416 in FIG. 4).

Figure 6:
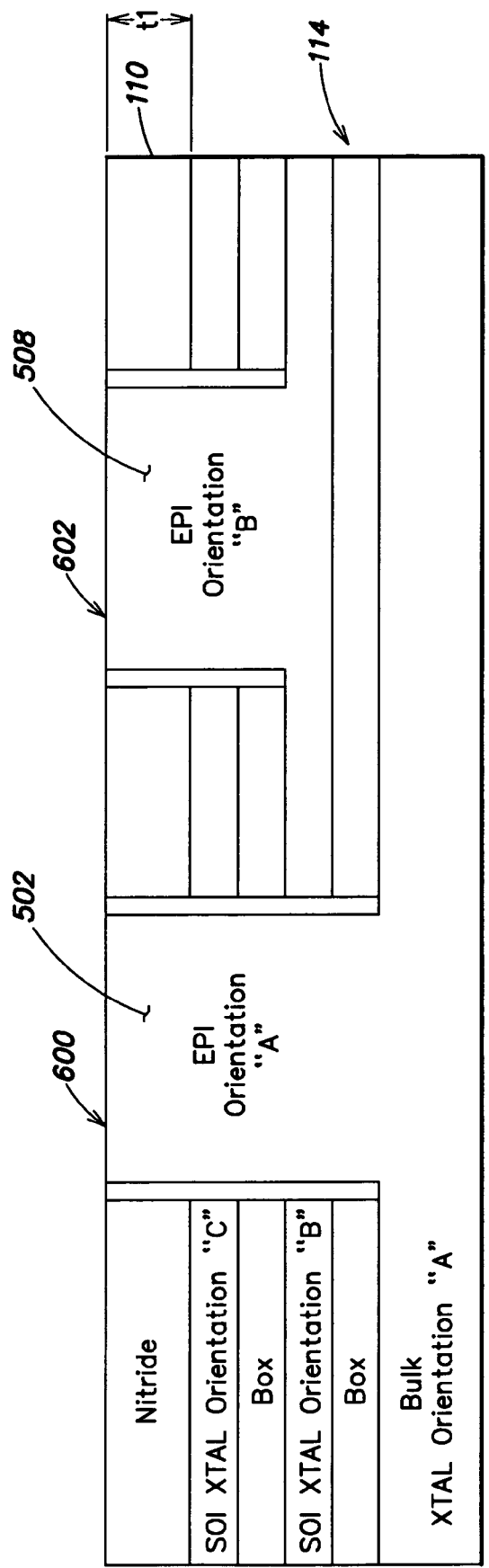
FIG. 6 illustrates a step of the first exemplary method of forming coplanar SOI regions of different crystal orientations on a substrate in which the epitaxially grown layers are planarized in accordance with an embodiment of the present invention.

FIG. 6 illustrates a step of the first exemplary method of forming coplanar SOI regions of different crystal orientations on a substrate in which the epitaxially grown layers are planarized in accordance with an embodiment of the present invention. With reference to FIG. 6, chemical mechanical planarization (CMP) or another suitable technique may be employed to planarize and polish the silicon 502 having the first crystal orientation and the silicon 508 having the second crystal orientation. In this manner, a first region 600 of silicon having a first crystal orientation A and a second region 602 having a second crystal orientation B may be formed. Top surfaces of the first region 600, second region 602 and nitride layer 110 may be coplanar. For example, in some embodiments, the silicon 502, 508 may be planarized and polished through the oxide layer (112 in FIG. 2) to the nitride layer 110. More specifically, the silicon 502, 508 may be planarized and polished (e.g., through the oxide layer) until a signature from the nitride layer 110 is detected, and a predetermined time thereafter, CMP may stop (although CMP may stop in a different manner). Therefore, the oxide layer 112 of the substrate 114 may prevent consumption of more than a negligible amount of the nitride layer 110 during CMP. Consequently, the thickness t1 of the nitride layer 110 may be known within a tolerance.

Figure 7:
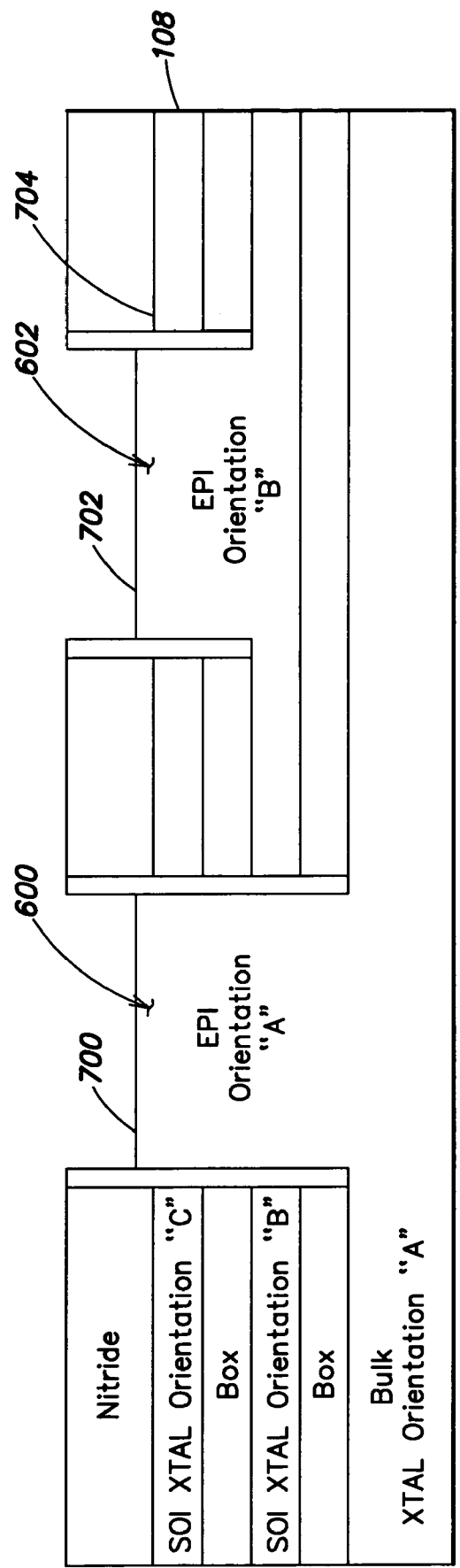
FIG. 7 illustrates a step of the first exemplary method of forming coplanar SOI regions of different crystal orientations on a substrate in which a top surface of the silicon region having the first crystal orientation and the silicon region having the second crystal orientation are recessed in accordance with an embodiment of the present invention.

FIG. 7 illustrates a step of the first exemplary method of forming coplanar SOI regions of different crystal orientations on a substrate in which a top surface of the silicon region having the first crystal orientation and the silicon region having the second crystal orientation are recessed in accordance with an embodiment of the present invention. With reference to FIG. 7, RIE or another suitable method may be employed to remove portions of the first region 600 of silicon having a first crystal orientation A and a second region 602 having a second crystal orientation B selective to nitride. In this manner, the first and second regions 600, 602 may be recessed. In some embodiments, the first and/or second regions 600, 602 may be recessed such that respective top surfaces 700, 702 of the first and second regions 600, 602 are near a top surface of 704 of the second SOI layer 108 having a third crystal orientation C. For example, the first and/or second regions 600, 602 may be recessed such that top surfaces 700, 702 of the first and/or second regions 600, 602 may be about 5 nm to about 20 nm above a top surface of 704 of the second SOI layer 108 (although the first and/or second regions 600, 602 may be recessed by a larger or smaller amount).

Figure 8:
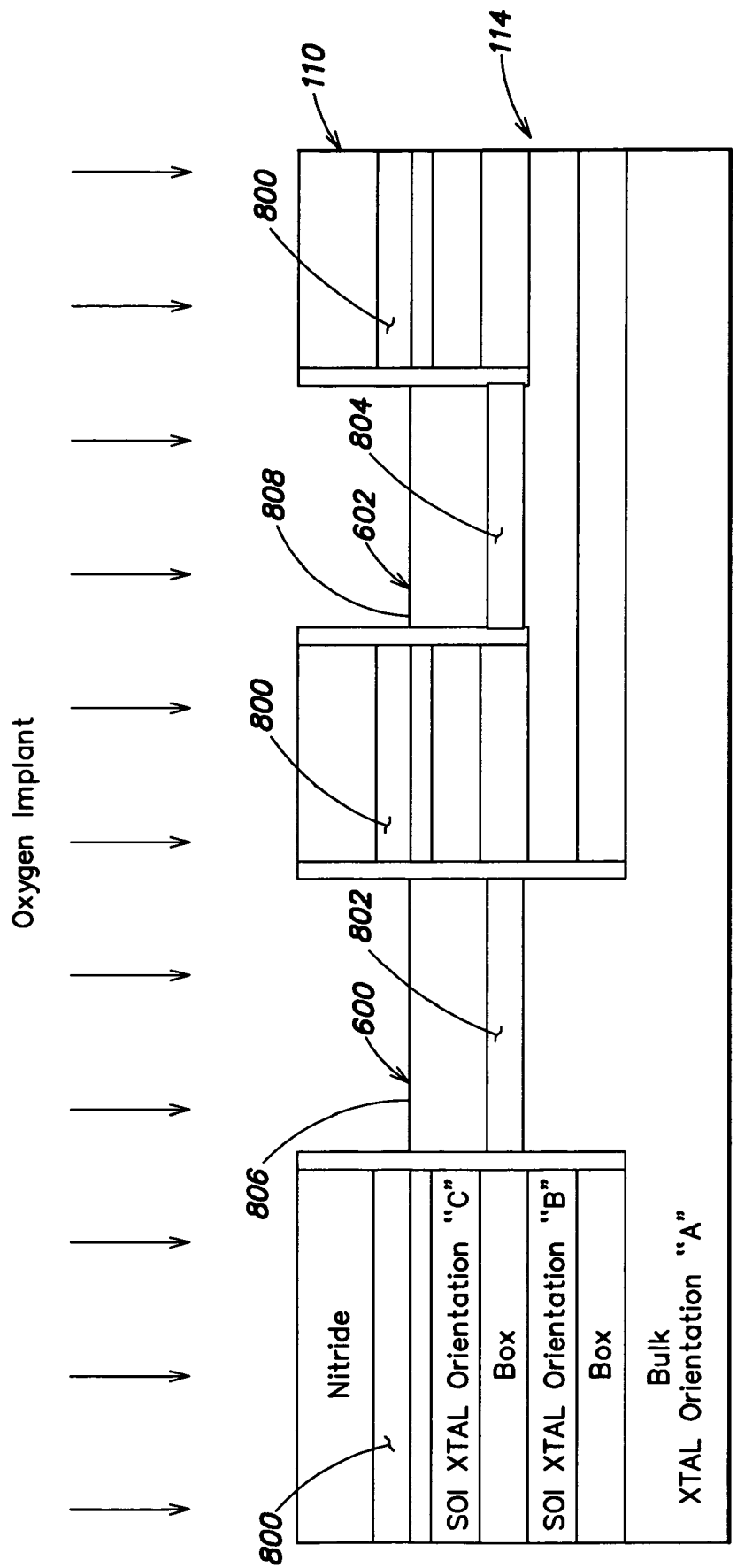
FIG. 8 illustrates a step of the first exemplary method of forming coplanar SOI regions of different crystal orientations on a substrate in which oxygen is implanted in the substrate in accordance with an embodiment of the present invention.

FIG. 8 illustrates a step of the first exemplary method of forming coplanar SOI regions of different crystal orientations on a substrate in which oxygen is implanted in the substrate in accordance with an embodiment of the present invention. With reference to FIG. 8, oxygen (e.g., ionized atomic or molecular oxygen) may be implanted into the substrate 114 such that one or more SOI regions may subsequently be formed. More specifically, one or more implanted oxygen regions 800, 802, 804 may be formed (e.g., in the nitride layer 110, first silicon region 600 and/or second silicon region 602). The implanted oxygen regions 802, 804 may serve as incompletely formed back oxide regions. Energy for implanting oxygen may be selected such that the subsequently-formed SOI regions are of a desired thickness. For example, a dose of about $2 \times 10^{17}$ to about $5 \times 10^{18}$ cm$^{-2}$ O$^+$ may be implanted using about 20 keV to about 200 keV of energy. Implanting oxygen may damage silicon (e.g., lattice) in respective top portions 806, 808 of the first and second regions 600, 602 (e.g., caused by the passage of the oxygen). In one embodiment, a temperature of about 400° C. to about 700° C. may be employed to implant the oxygen. Such an elevated temperature range may reduce damage to silicon structure (e.g., top portions 806, 808) caused by the implanted oxygen and/or increase the solubility of the implanted oxygen into the silicon (e.g., the first region 600 and second region 602).

The above dose, energy and temperature ranges are exemplary. Therefore, a larger or smaller range and/or different range may be employed for the dose, energy and/or temperature. Further, although in the example above O$^+$ was implanted into the substrate being manufactured 114, in other embodiments, ionized molecular oxygen, such as O$_2^+$, may be implanted. Further, although oxygen is implanted into the first and second regions 600, 602 during a single step, in some embodiments, oxygen may be implanted into the substrate 114 multiple times. Each oxygen implant may have its own set of process parameters such as dose, energy and/or temperature ranges. In this manner, the implanted oxide region 802 may be formed in the first silicon region 600 during a first oxygen implant step and the implanted oxide region 804 may be formed in the second silicon region 602 during a second oxygen implant step.

Figure 9:
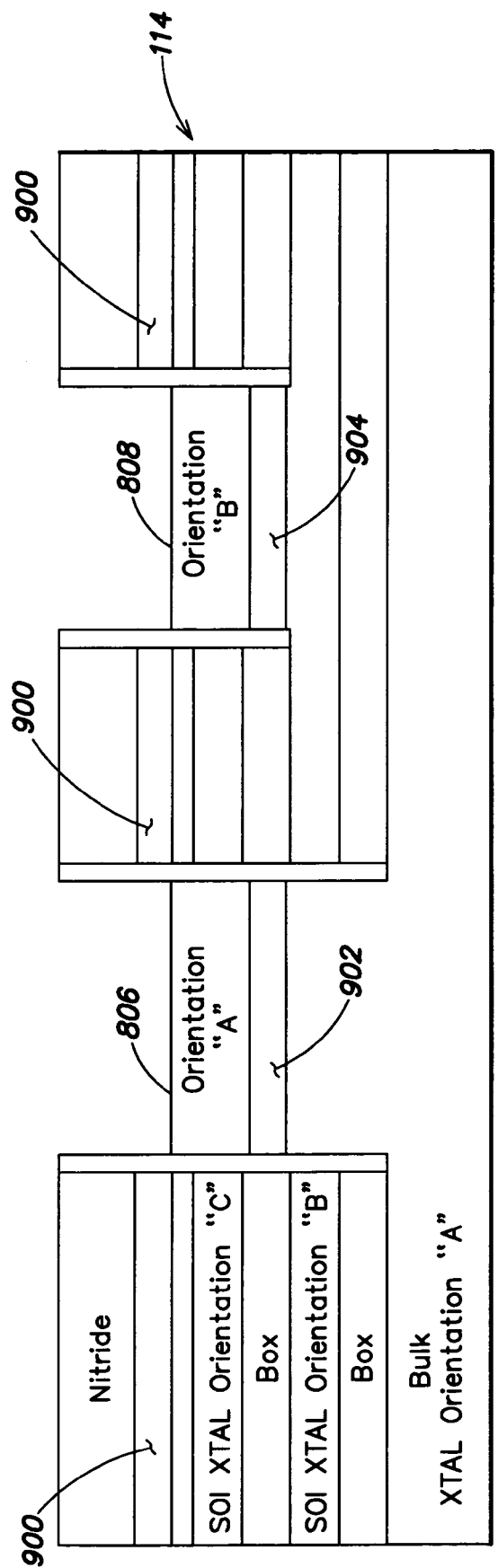
FIG. 9 illustrates a step of the first exemplary method of forming coplanar SOI regions of different crystal orientations on a substrate in which the substrate undergoes annealing in accordance with an embodiment of the present invention.

FIG. 9 illustrates a step of the first exemplary method of forming coplanar SOI regions of different crystal orientations on a substrate in which the substrate undergoes annealing in accordance with an embodiment of the present invention. With reference to FIG. 9, the substrate 114 may be subjected to an annealing process in which any structural damage to respective top portions (806, 808 in FIG. 8) of the first and second regions (600, 602 in FIG. 8) caused while implanting oxygen may be repaired. Further, annealing may fully form buried oxide regions 900, 902, 904. More specifically, annealing may convert the implanted oxygen regions (800, 802, 804 in FIG. 8) to oxide regions (e.g., buried oxide regions) 900, 902, 904 by chemically combining oxygen with adjacent silicon (for implanted oxygen regions 802, 804) or nitrogen (for implanted oxygen regions 800).

Annealing may be performed using temperatures of about 1100° C. to about 1300° C. for about 0.5 to about six hours. A larger or smaller and/or different temperature range may be employed. Further, annealing may be performed for a larger or smaller and/or different time period. Annealing may be performed, for example, in an inert ambient environment. Alternatively, annealing may be performed in an oxidizing ambient environment such as an internal total oxidation (ITOX) environment. Annealing in such an environment may thicken the selected implant regions (800, 802, 804 in FIG. 8) as the buried oxide regions 900, 902, 904 form. Consequently, annealing in such an environment may thin the respective top portions 806, 808 more than annealing using the same temperature range in an inert ambient environment.

In this manner, an insulator 902, 904 (e.g., SiO$_2$) may be formed underneath a thin layer (e.g., the top portions 806, 808) of high quality silicon. The respective top portions 806, 808 of the first and second regions 600, 602 may be about 15 nm to about 100 nm thick (although a larger or smaller and/or different thickness range may be employed for the first and/or second region 600, 602).

Figure 10:
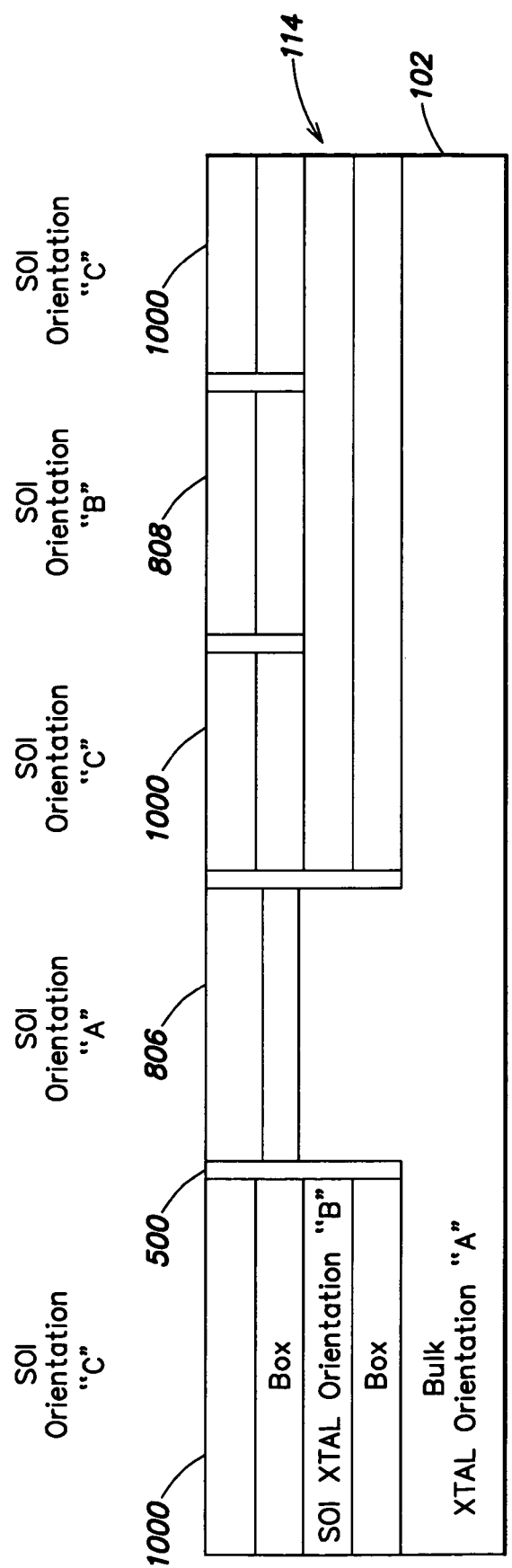
FIG. 10 illustrates a step of the first exemplary method of forming coplanar SOI regions of different crystal orientations on a substrate in which nitride is etched and a surface of the substrate is planarized in accordance with an embodiment of the present invention.

FIG. 10 illustrates a step of the first exemplary method of forming coplanar SOI regions of different crystal orientations on a substrate in which nitride is etched and a surface of the substrate is planarized in accordance with an embodiment of the present invention. With reference to FIG. 10, RIE or another suitable method may be employed to remove nitride selective to oxide and silicon. In this manner, regions of the nitride layer above the buried oxide regions (900 in FIG. 9) may be removed. Thereafter, CMP or another suitable method may be employed to polish a top surface of the substrate 114 such that the first silicon region 806 having a first crystal orientation A, second silicon region 808 having a second crystal orientation B and a third silicon region 1000 having a third crystal orientation C are coplanar. For example, during CMP, portions of the nitride layer 110 above the buried oxide regions (900 in FIG. 9), the buried oxide regions 900 and/or portions of the oxide spacers 500 may be removed. Further, a predetermined amount of silicon from the first, second and/or third silicon region 806, 808, 1000 may be consumed such that desired respective thicknesses of the first, second and third silicon regions 806, 808, 1000 may be achieved. In this manner, the substrate 114 is prepared for normal processing (e.g., for chip fabrication). Therefore, electronic devices may be formed on SOI regions (e.g., the first, second and third silicon regions 806, 808, 1000) and/or the bulk substrate layer 102 of substrate 114 being manufactured.

Through use of the first exemplary method, a substrate 114 including at least three SOI regions 806, 808, 1000, each of which has a different crystal orientation, may be formed. The at least three SOI regions 806, 808, 1000 of the substrate 114 may be coplanar. Furthermore, one or more of the at least three SOI regions 806, 808, 1000 may be separated from an adjacent SOI region by a narrow insulating region (e.g., an oxide spacer 500). As stated, an oxide spacer 500 may be about 2 nm to about 200 nm wide, and more preferably of about 10 nm to about 30 nm wide. In this manner, the relative area of a top surface of an SOI region 806, 808, 1000 may be large compared to areas of a top surface of an oxide spacer 500 included in the substrate 114. Consequently, the first exemplary method may efficiently use substrate real estate, and therefore, may increase and/or maximize a number of electronic devices that may be formed thereon. The respective crystal orientation of each of the at least three SOI regions 806, 808, 1000 may be selected such that mobility, or other electronic parameters, of electronic devices subsequently formed thereon, respectively, is improved and/or optimized.

FIGS. 11-16 illustrate cross-sectional side views of a second exemplary method of forming coplanar SOI regions of different crystal orientations on a substrate 1100 in accordance with an embodiment of the present invention. Steps of the second exemplary method may be similar to the steps of the first exemplary method illustrated with reference to FIGS. 1-6. Therefore, description of the second exemplary method begins with a substrate 1100 similar to the substrate 114 of FIG. 6. Further, the same reference numbers employed to refer to portions of the substrate 114 may be employed to refer to corresponding portions of the substrate 1100.

Figure 11:
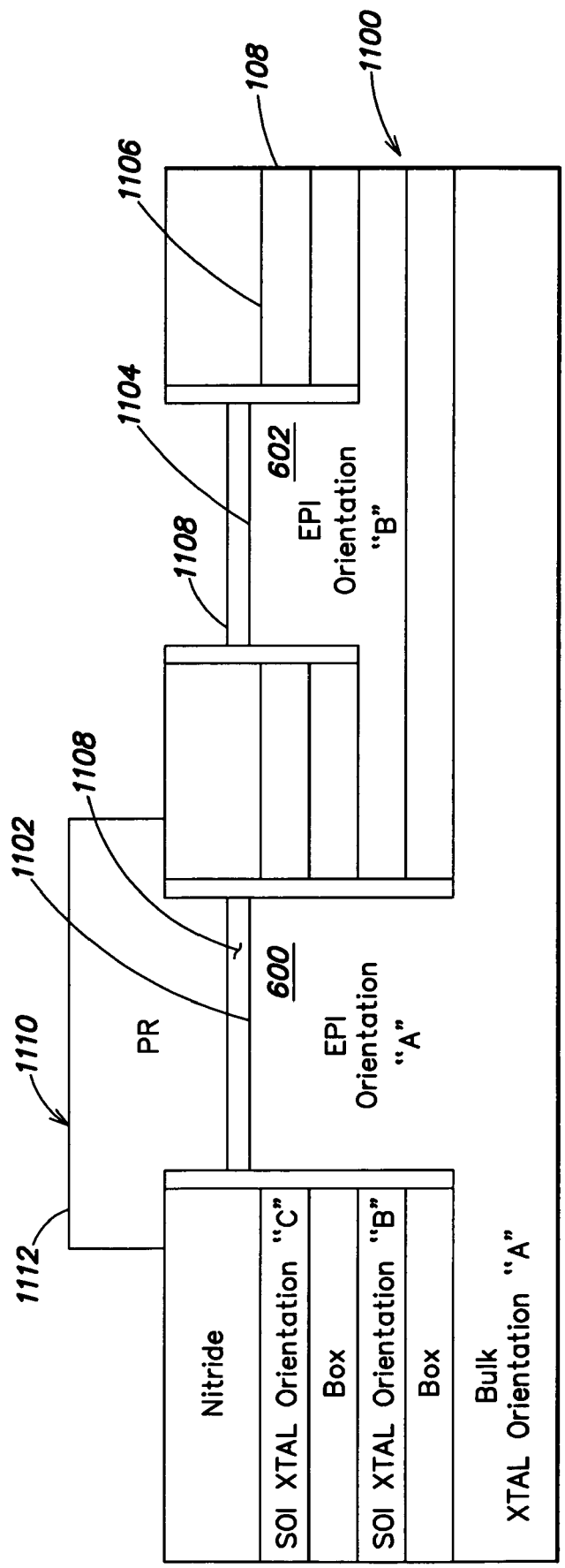
FIG. 11 illustrates a cross-sectional side view of a step of a second exemplary method of forming coplanar SOI regions of different crystal orientations on a substrate in accordance with an embodiment of the present invention.

With reference to FIG. 11, similar to the step of the first exemplary method shown in FIG. 7, RIE or another suitable method may be employed to remove portions of the first region 600 of silicon having a first crystal orientation A and the second region 602 of silicon having a second crystal orientation B selective to nitride. In this manner, the first and second regions 600, 602 may be recessed. In some embodiments, the first and/or second regions 600, 602 may be recessed such that respective top surfaces 1102, 1104 of the first and second regions 600, 602 are near a top surface 1106 of the second SOI layer 108 having a third crystal orientation C. For example, the first and/or second regions 600, 602 may be recessed such that top surfaces 1102, 1104 of the first and/or second regions 600, 602 may be about 5 nm to about 20 nm above a top surface 1106 of the second SOI layer 108 (although the first and/or second regions 600, 602 may be recessed by a larger or smaller amount).

Thereafter, a layer 1108 of screen oxide may be grown on the exposed top surfaces 1102, 1104 of the first and second regions 600, 602, respectively, using thermal oxidation or another suitable method. The layer 1108 of screen oxide may serve as an etch stop or a marker layer during subsequent substrate processing. In some embodiments, the layer of screen oxide may be about 1 nm to about 15 nm thick (although a larger or smaller and/or different range of thickness may be employed).

A spin-on technique or another suitable method may be employed to deposit a photoresist layer 1110 on the substrate 1100. The photoresist layer 1110 may be patterned with a mask such that portions of the photoresist layer 1110 may be removed during a subsequent process (e.g., developing). More specifically, after exposure to illumination through a photomask, portions of photoresist may be removed by the develop process. For example, this process removes portions of the photoresist layer 1110 (e.g., above the second region 602 of silicon having the second crystal orientation B) such that a block mask 1112 remains above the first region 600 of silicon having the first crystal orientation A. The block mask 1112 may prevent portions of the first region 600 of silicon from subsequent processing. Alternatively, rather than the photoresist layer 1110, a layer of hard mask material such as polysilicon or the like, may be deposited, and thereafter, selectively etched to yield the block mask 1112.

Figure 12:
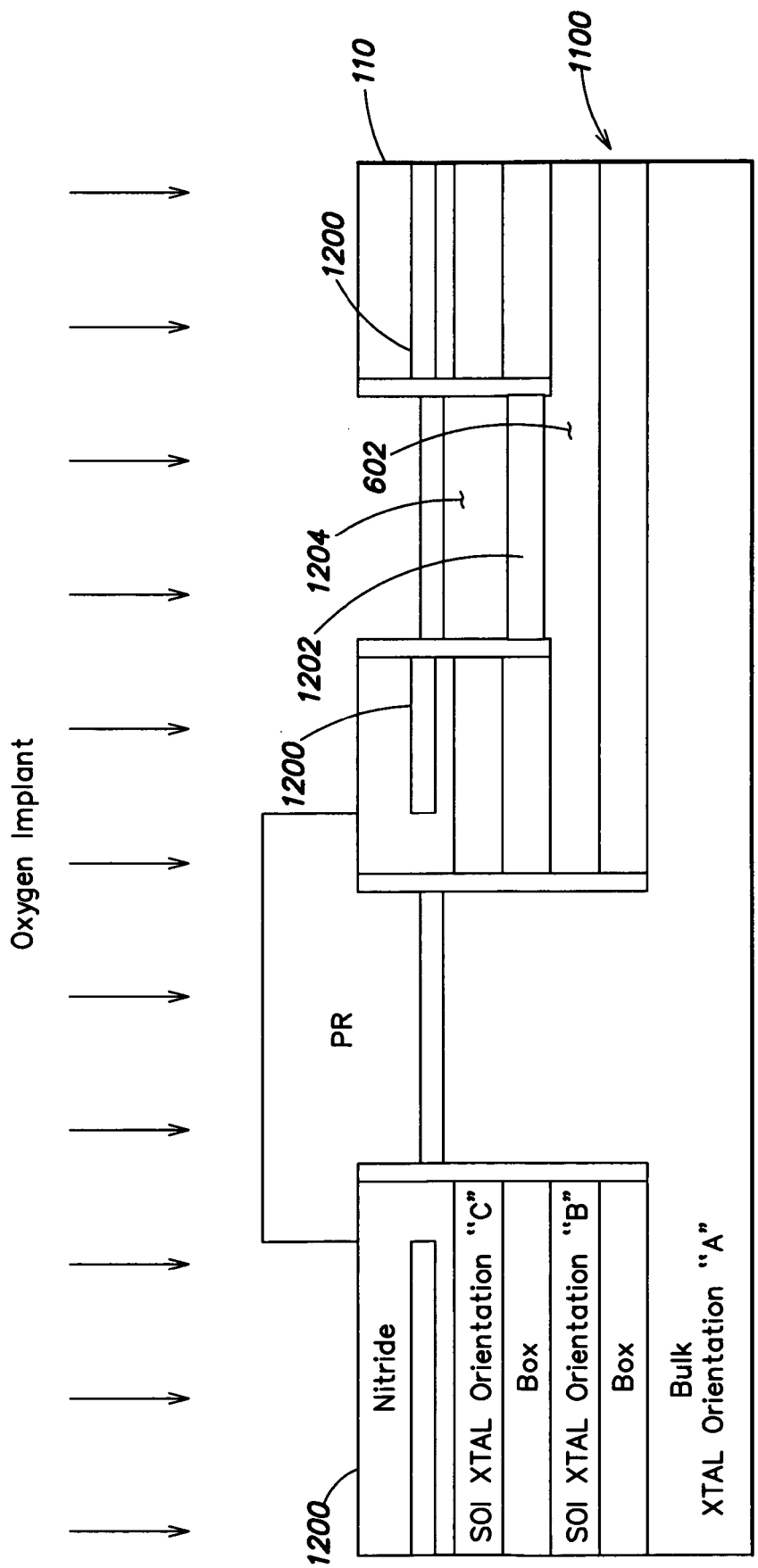
FIG. 12 illustrates a step of the second exemplary method of forming coplanar SOI regions of different crystal orientations on a substrate in which oxygen is implanted in the substrate in accordance with an embodiment of the present invention.

FIG. 12 illustrates a step of the second exemplary method of forming coplanar SOI regions of different crystal orientations on a substrate in which oxygen is implanted in the substrate in accordance with an embodiment of the present invention. With reference to FIG. 12, similar to the step of the first exemplary method illustrated with reference to FIG. 8, oxygen (e.g., ionized atomic or molecular oxygen) may be implanted into the substrate 1100 such that one or more SOI regions may subsequently be formed. More specifically, one or more implanted oxygen regions 1200, 1202 may be formed (e.g., in the nitride layer 110 and/or second silicon region 602). The implanted oxygen region 1202 may serve as an incompletely formed back oxide region. Energy for implanting oxygen may be selected such that the subsequently-formed SOI regions are of a desired thickness. For example, a dose of about $2 \times 10^{17}$ to about $5 \times 10^{18}$ cm$^{-2}$ O$^+$ may be implanted using about 20 energy. Implanting oxygen may damage silicon (e.g., lattice) in a top portion 1204 of the second region 602 (e.g., caused by the passage of the oxygen). In some embodiments, for example, embodiments in which a hard mask material is employed to form the block mask, a temperature of about 400° C. to about 700° C. may be employed to implant the oxygen. Such an elevated temperature range may reduce damage to silicon structure caused by the implanted oxygen and/or increase the solubility of the implanted oxygen into the silicon (e.g., the second region 602).

The above dose, energy and temperature ranges are exemplary. Therefore, a larger or smaller range and/or different range may be employed for the dose, energy and/or temperature. Further, although in the example above O$^+$ was implanted into the substrate being manufactured 1100, in other embodiments, ionized molecular oxygen, such as O$_2^+$, may be implanted.

Figure 13:
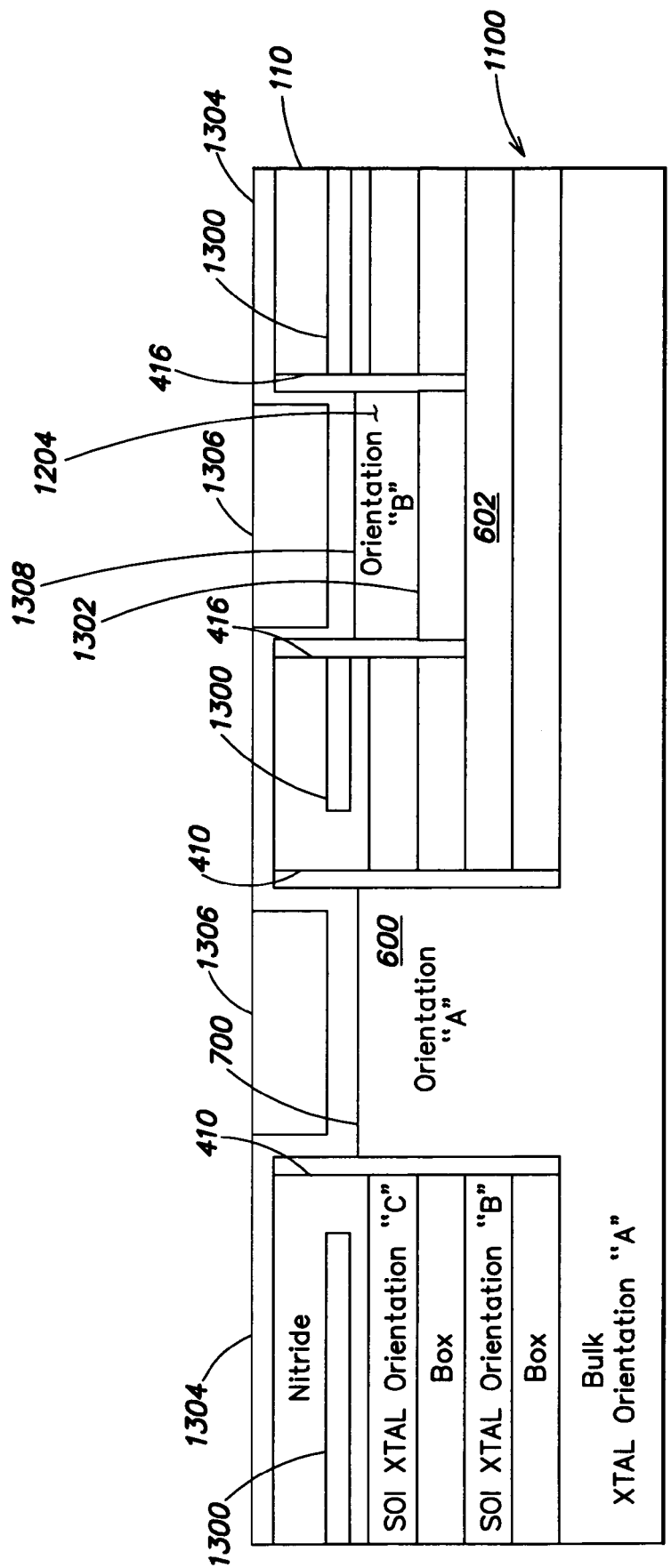
FIG. 13 illustrates a step of the second exemplary method of forming coplanar SOI regions of different crystal orientations on a substrate in which photoresist is stripped, substrate annealing is performed, oxide and nitride are deposited, and the substrate is planarized in accordance with an embodiment of the present invention.

FIG. 13 illustrates a step of the second exemplary method of forming coplanar SOI regions of different crystal orientations on a substrate in which photoresist is stripped, substrate annealing is performed, oxide and nitride are deposited, and the substrate is planarized in accordance with an embodiment of the present invention. With reference to FIG. 13, a photoresist stripper bath or another suitable method may be employed to strip photoresist (e.g., the block mask (1112 in FIG. 11)) from the substrate 1100. Alternatively, if a block mask 1112 of hard mask material is formed in a preceding step, a selective isotropic etch or another suitable method may be employed to remove such mask.

Thereafter, the substrate 1100 may be subjected to an annealing process in which any structural damage to the top portion (1204 in FIG. 12) of the second region (602 in FIG. 12) caused while implanting oxygen may be repaired. Further, annealing may fully form buried oxide regions 1300, 1302. More specifically, annealing may convert the implanted oxygen regions (1200, 1202 in FIG. 12) to oxide regions (e.g., buried oxide regions) 1300, 1302 by chemically combining oxygen with adjacent silicon (for implanted oxygen region 1202) and adjacent nitrogen (for implanted oxygen region 1200).

Annealing may be performed using temperatures of about 1100° C. to about 1300° C. for about 0.5 to about six hours. A larger or smaller and/or different temperature range may be employed. Further, annealing may be performed for a larger or smaller and/or different time period. Annealing may be performed, for example, in an inert ambient environment. Alternatively, annealing may be performed in an oxidizing ambient environment such as an internal total oxidation (ITOX) environment. Annealing in such an environment may thicken the selected implant regions (1200, 1202 in FIG. 12) as the buried oxide regions 1300, 1302 form. Consequently, annealing in such an environment may thin the top portion 1204 of the second region 602 more than annealing using the same temperature range in an inert ambient environment.

In this manner, an insulator 1302, (e.g., SiO$_2$) may be formed underneath a thin layer (e.g., the top portion 1204) of high quality silicon. The top portion 1204 of the second region 602 may be about 15 nm to about 100 nm thick (although a larger or smaller and/or different thickness range may be employed for the second region 1204).

Thereafter, CVD or another suitable method may be employed to deposit (e.g., conformally) a layer 1304 of oxide. In some embodiments, the thickness of the deposited oxide layer is about 2 nm to about 30 nm (although a larger or smaller and/or different range may be employed).

CVD or another suitable method may be employed to deposit a layer 1306 of nitride or another suitable material such as polysilicon or photoresist on a top surface of the substrate 1100. In this manner, nitride may be formed in a recess formed by the oxide layer 1304 adjacent sidewalls 410 of the nitride layer 110 and the top surface 700 of the first silicon region 600. Similarly, nitride may be formed in a recess formed by the oxide layer 1304 adjacent sidewalls 416 of the nitride layer 110 and a top surface 1308 of the top portion 1204 of the second silicon region 602. More specifically, the nitride may be deposited such that the recesses are filled to a level above the oxide layer 1304.

Thereafter, CMP or another suitable method may be employed to planarize and polish the nitride layer 1306 to the oxide layer 1304. More specifically, the nitride layer 1306 may be planarized and polished until a signature from the oxide layer 1304 is detected, and a predetermined time thereafter, CMP may stop (although CMP may stop in a different manner). In this manner, the oxide layer 1304 of the substrate 1100 may serve as a marker layer to terminate nitride layer polishing.

Figure 14:
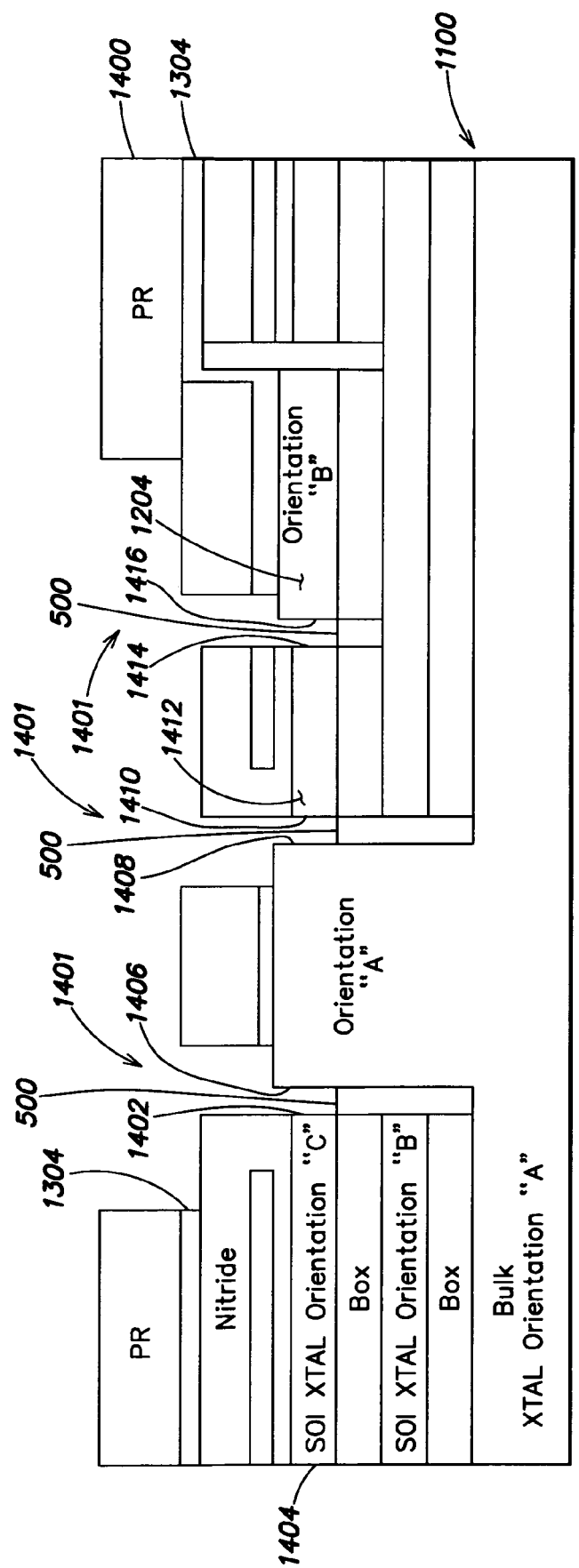
FIG. 14 illustrates a step of the second exemplary method of forming coplanar SOI regions of different crystal orientations on a substrate in which oxide spacers are recessed in accordance with an embodiment of the present invention.

FIG. 14 illustrates a step of the second exemplary method of forming coplanar SOI regions of different crystal orientations on a substrate in which oxide spacers are recessed in accordance with an embodiment of the present invention. With reference to FIG. 14, a spin-on technique or another suitable method may be employed to deposit a photoresist layer 1400 on the substrate 1100. The photoresist layer 1400 may be exposed with a mask such that portions of the photoresist layer 1400 may be removed during a subsequent process (e.g., developing). For example, portions of the photoresist layer 1400 above regions of where contact to an SOI region is desired may be exposed.

Reactive ion etching (RIE) or another suitable method may be employed to etch portions of the oxide layer 1304 and oxide spacers 500 exposed by the photoresist layer 1400. In this manner, one or more oxide spacers 500 may be selectively recessed thereby forming recesses 1401 in the substrate 1100. Consequently, sidewalls of silicon regions previously coupled to such recessed portions of the oxide spacer 500 may be exposed. For example, a sidewall 1402 of a portion of first silicon region 1404 having a third crystal orientation C may exposed and a sidewall 1406 of a portion of the silicon region 600 having a first crystal orientation A may be exposed. Further, another sidewall 1408 of the portion of the silicon region 600 having the first crystal orientation A and a sidewall 1410 of a portion of a second silicon region 1412 having the third crystal orientation C may be exposed. Additionally, another sidewall 1414 of the second silicon region 1412 having the third crystal orientation C and a sidewall 1416 of the top portion 1204 of the silicon region having the second crystal orientation B may be exposed. In some embodiments, an oxide spacer 500 may be recessed to a depth approximately slightly below a bottom of a silicon region 1404, 1412 having the third crystal orientation C adjacent the oxide spacer 500 (although one or more oxide spacers 500 may be recessed deeper or shallower).

Figure 15:
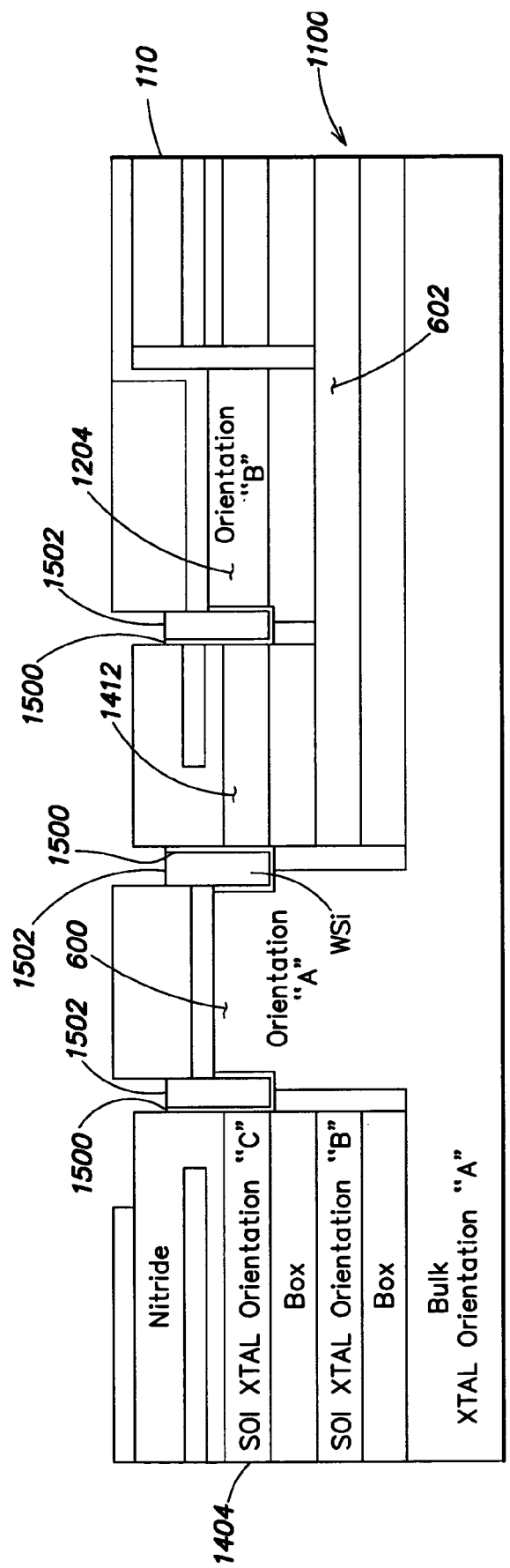
FIG. 15 illustrates a step of the second exemplary method of forming coplanar SOI regions of different crystal orientations on a substrate in which a layer of metallic nitride and silicide is deposited on the substrate and selectively etched to form a conductive material between adjacent silicon regions in accordance with an embodiment of the present invention.

FIG. 15 illustrates a step of the second exemplary method of forming coplanar SOI regions of different crystal orientations on a substrate in which a layer of metallic nitride and silicide is deposited on the substrate and selectively etched to form a conductive material between adjacent silicon regions in accordance with an embodiment of the present invention. With reference to FIG. 15, a photoresist stripper bath or another suitable method may be employed to strip remaining portions of the photoresist layer (1400 in FIG. 14) from the substrate 1100. CVD or another suitable method may be employed to deposit (e.g., conformally) a conductive barrier layer 1500 on a top surface of the substrate 1100. Titanium nitride (TiN) or another suitable material may be employed as the barrier layer 1500. In this manner, the barrier layer 1500 may serve as a liner for a layer of material subsequently deposited on the substrate 1100. For example, the barrier layer 1500 may line the recesses 1401 formed in the substrate by etching portions of the oxide spacers 500. The barrier layer 1500 may prevent diffusion of material subsequently deposited thereon into adjacent silicon. The barrier layer 1500 may be about 1 nm to about 3 nm thick (although a larger or smaller and/or different thickness range may be employed).

Thereafter, CVD or another suitable method may be employed to deposit a layer 1502 of a refractory conductive material such as tungsten silicide (WSi), polysilicon, nickel silicide or the like on a top surface of the substrate 1100. The layer 1502 of the refractory conductive material may be deposited such that the refractory conductive material fills the recesses 1401. In this manner, adjacent SOI regions, such as the first silicon region 1404 having a third crystal orientation C and the silicon region 600 having a first crystal orientation A, the silicon region 600 having the first crystal orientation A and the second silicon region 1412 having the third crystal orientation C, or the second silicon region 1412 having the third crystal orientation C and the top portion 1204 of the silicon region 602 having the second crystal orientation B, may be coupled (e.g., electrically).

RIE or another suitable method may be employed remove portions of the barrier layer 1500 and refractory conductive material layer 1502 from the substrate 1100. For example, portions of the barrier layer 1500 and refractory conductive material layer 1502 may be removed from a top horizontal surface of the substrate. Additionally, portions of the barrier layer 1500 and refractory conductive material layer 1502 in the recesses (1401 in FIG. 14) may be removed. In this manner, the barrier layer 1500 and refractory conductive material layer 1502 may be recessed below a top surface of the nitride layer 110.

Figure 16:
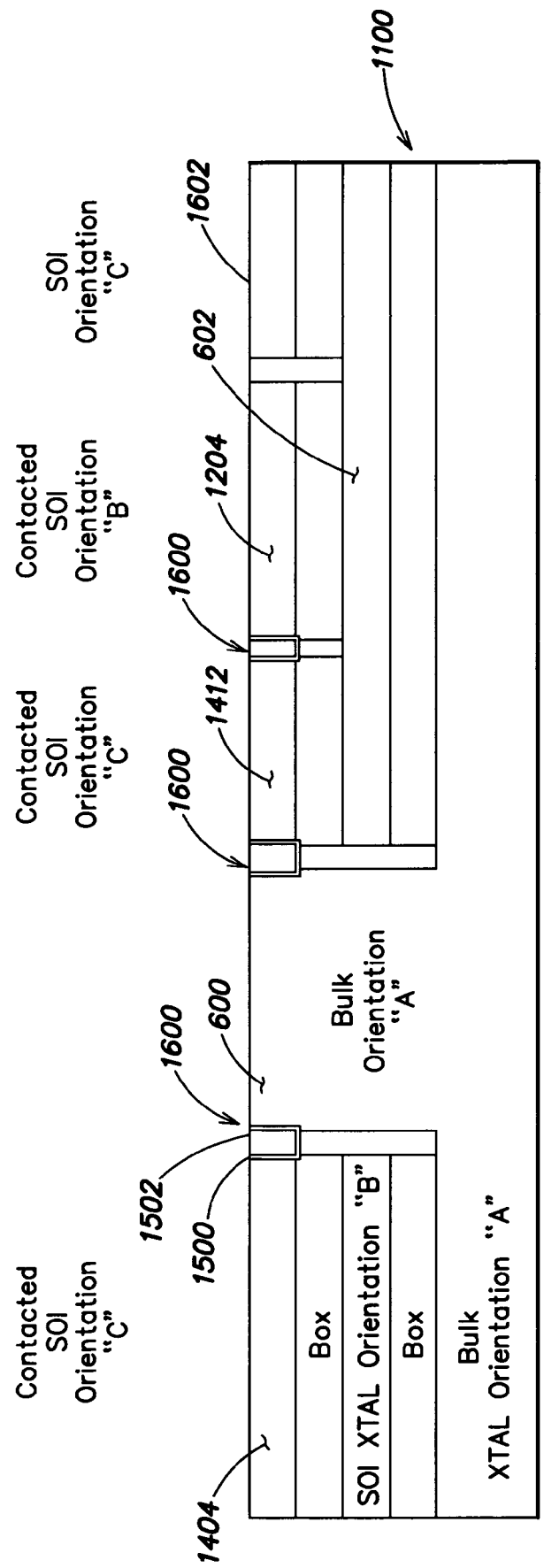
FIG. 16 illustrates a step of the second exemplary method of forming coplanar SOI regions of different crystal orientations on a substrate in which oxide and nitride are etched and a surface of the substrate is planarized in accordance with an embodiment of the present invention.

FIG. 16 illustrates a step of the second exemplary method of forming coplanar SOI regions of different crystal orientations on a substrate in which oxide and nitride are etched and a surface of the substrate is planarized in accordance with an embodiment of the present invention. With reference to FIG. 16, RIE or another suitable method may be employed to remove the oxide layer (1304 in FIG. 14) and nitride layer (110 in FIG. 15) (e.g., underlying the oxide layer 1304). Thereafter, CMP or another suitable method may be employed to planarize and polish the substrate 1100 such that SOI regions having different crystal orientations, such as the first or second silicon region 1404, 1412 having the third crystal orientation C and the top portion 1204 of the silicon region 602 having the second crystal orientation B, are coplanar. More specifically, CMP may remove remaining nitride (e.g., portions of the nitride layer 1306 in FIG. 13) and oxide (e.g., portions of the oxide layer 1304 underlying the nitride layer 1306 and the screen oxide layer (1108 in FIG. 11)) from the substrate 1100. Additionally, CMP may consume a predetermined amount of silicon in one or more of the first silicon region 1404 having a third crystal orientation C, the silicon region 600 having a first crystal orientation A, the second silicon region 1412 having the third crystal orientation C, the second silicon region 1412 having the third crystal orientation C and the top portion 1204 of the silicon region 602 having a second crystal orientation B such that a desired thicknesses of such regions may be achieved. Consequently, CMP may consume top portions of the barrier layer 1500 and refractory conductive material layer 1502. In this manner, remaining portions of the barrier layer 1500 and refractory conductive material layer 1502 between adjacent silicon regions may form one or more contact bridges 1600. For example, a contact bridge 1600 may be formed between the first silicon region 1404 having the third crystal orientation C and the silicon region 600 (e.g., bulk substrate) having the first crystal orientation A, thereby electrically coupling the regions 1404, 600. Additionally, a contact bridge 1600 may be formed between the silicon region 600 and the second silicon region 1412 having the third crystal orientation C, thereby electrically coupling the regions 600, 1412. Additionally, a contact bridge 1600 may be formed between the second silicon region 1412 having the third crystal orientation C and the top portion 1204 of the silicon region 602 having the second crystal orientation B.

The silicon region 600 (e.g., bulk substrate) having the first crystal orientation A may be coupled to a fixed potential. Therefore, the silicon region 600 may provide the fixed potential to the first and second silicon regions 1404, 1412 having the third crystal orientation C via respective contact bridges 1600 coupled thereto. Consequently, the second silicon region 1404 having the third crystal orientation C may provide the fixed potential to the top portion 1204 of the silicon region 602 having the second crystal orientation B. In this manner, the silicon region 600 may provide a fixed potential to one or more SOI regions (e.g., the first and second silicon regions 1404, 1412 having the third crystal orientation C and the top portion 1204 of the silicon region 602 having the second crystal orientation B) that would otherwise be of a floating potential (e.g., floating body). In this manner, the present invention may reduce and/or eliminate adverse effects of floating body SOI regions. Additionally, the substrate 1100 may include one or more SOI regions 1602 having the second or third crystal orientation B, C of a floating potential.

In this manner, the substrate 1100 is prepared for normal processing (e.g., for chip fabrication). Therefore, electronic devices may be formed on SOI regions (e.g., the first silicon region 1404 having the third crystal orientation C, second silicon region 1412 having the third crystal orientation C and/or top portion 1204 of the silicon region 602 having the second crystal orientation) and/or the silicon region 600 (e.g., bulk substrate) having the first crystal orientation A of substrate 1100.

Through use of the second exemplary method, a substrate 1100 including a bulk substrate silicon region and a coplanar plurality of SOI regions may be formed such that each of the bulk substrate region and plurality of SOI regions has a different crystal orientation. Further, an electrical contact may be formed between adjacent regions of the substrate such that a fixed potential of a first region may be applied to an adjacent SOI region. The width of the contact may be thin relative to the bulk substrate silicon region and/or plurality of SOI regions. Consequently, the second exemplary method may efficiently use substrate real estate, and therefore, may increase and/or maximize a number of electronic devices that may be formed thereon. The respective crystal orientation of each of the bulk substrate silicon region and plurality of SOI regions may be selected such that mobility, or other electronic parameters, of electronic devices subsequently formed thereon, respectively, is improved and/or optimized.

The foregoing description discloses only exemplary embodiments of the invention. Modifications of the above disclosed apparatus and methods which fall within the scope of the invention will be readily apparent to those of ordinary skill in the art. For instance, in some embodiments, a substrate 1100 including a bulk substrate silicon region and a coplanar plurality of SOI regions may be formed such that each of the bulk substrate region and coplanar plurality of SOI regions has a different crystal orientation and adjacent regions are separated by an oxide spacer. For example, in such embodiments, after annealing in the step of the second exemplary method illustrated with reference to FIG. 13, CMP or another suitable method may be employed to planarize and polish a top surface of the substrate 1100 to the first and second silicon regions 1404, 1412 having the third crystal orientation C.

The present methods and apparatus may provide a plurality of coplanar SOI regions each of which has a different crystal orientation. In this manner, a first SOI region may have a crystal orientation (e.g., 100) optimized for electron mobility, and therefore, optimized for NFETs. Similarly, a second SOI region may have a crystal orientation (e.g., 110) optimized for hole mobility, and therefore, optimized for PFETs. Further, transistors formed in either region may receive benefits of SOI such as reduced junction capacitance, dynamic $V_t$ effects and/or drain current overshoot due to gate to body coupling. In some embodiments, the present methods and apparatus may provide one or more regions of bulk substrate, which have a crystal orientation different than any of the plurality of SOI regions, coplanar with the plurality of SOI regions. The crystal orientation of the silicon of the bulk substrate may be optimized for low-leakage devices such as DRAM cells.

Additionally, in some embodiments, the present invention provides methods and apparatus for selectively coupling (e.g., via a contact bridge) one or more of a plurality of coplanar floating SOI regions (e.g., SOI regions of a floating potential) to a coplanar bulk substrate region of a fixed potential so that the fixed potential is provided to the contacted SOI region. In this manner, the contacted SOI region may not experience deleterious floating-body effects, but may still provide a low junction capacitance. A circuit designer may decide which of the plurality of coplanar SOI regions of different crystal orientations, respectively, will contact a fixed potential and which will be of a floating potential.

In some embodiments described above a substrate includes three coplanar silicon regions, each of which has a different crystal orientation. Some of the coplanar regions may be SOI regions. However, in other embodiments, the substrate may include a larger number of coplanar regions, each of which has a different crystal orientation, and where some of the coplanar regions may be SOI regions.

Accordingly, while the present invention has been disclosed in connection with exemplary embodiments thereof, it should be understood that other embodiments may fall within the spirit and scope of the invention, as defined by the following claims.

The invention claimed is:

1. A method of semiconductor device manufacturing, comprising:

providing a substrate; and forming a first silicon-on-insulator (SOI) region having a first crystal orientation, a second SOI region having a second crystal orientation and a third SOI region having a third crystal orientation on the substrate, wherein:

the first, second and third SOI regions are coplanar;

providing the substrate includes providing a substrate including a bulk substrate layer having the first crystal orientation below a silicon-on-insulator (SOI) layer having the second crystal orientation below an SOI layer having the third crystal orientation; and forming a first SOI region having the first crystal orientation, a second SOI region having the second crystal orientation and a third SOI region having the third crystal orientation on the substrate includes:

selectively etching one or more portions of the substrate to the SOI layer having the second crystal orientation;

selectively etching one or more portions of the substrate to the bulk substrate layer having the first crystal orientation; and forming oxide spacers on sidewalls exposed by selectively etching one or more portions of the substrate to the SOI layer having the second crystal orientation and selectively etching one or more portions of the substrate to the bulk substrate layer.

2. The method of claim 1 wherein one or more of the oxide spacers are about 2 nm to about 200 nm thick.

3. The method of claim 1 wherein forming a first SQl region having the first crystal orientation, a second SOI region having the second crystal orientation and a third SOI region having the third crystal orientation on the substrate further includes:

growing a first epitaxial layer of silicon on a top surface of the SOI layer having the second crystal orientation exposed by the selective etching;

growing a second epitaxial layer of silicon on a top surface of the bulk substrate layer exposed by the selective etching;

selectively etching the first epitaxial layer approximately to a top surface of the SOI layer having the third crystal orientation; and selectively etching the second epitaxial layer approximately to the top surface of the SOI layer having the third crystal orientation.

4. The method of claim 3 wherein forming a first SOI region having the first crystal orientation, a second SOI region having the second crystal orientation and a third SOI region having the third crystal orientation on the substrate further includes:

implanting the substrate with oxygen;

annealing the substrate; and planarizing a top surface of the substrate.

* * * * *